United States Patent
Audy et al.

(10) Patent No.: US 7,327,595 B2
(45) Date of Patent: Feb. 5, 2008

(54) DYNAMICALLY READ FUSE CELL

(75) Inventors: Jonathan Audy, Los Gatos, CA (US); Trey Roessig, Fremont, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/431,207

(22) Filed: May 9, 2006

(65) Prior Publication Data

US 2007/0274118 A1 Nov. 29, 2007

(51) Int. Cl.
  *G11C 17/18* (2006.01)
(52) U.S. Cl. ................................ 365/96; 365/225.7
(58) Field of Classification Search ............... 365/96, 365/189.04, 189.07, 189.08, 201, 225.7, 365/207, 210, 148, 158, 189.02, 222; 326/104; 327/525
  See application file for complete search history.

(56) References Cited

U.S. PATENT DOCUMENTS

| | | | |
|---|---|---|---|
| 6,384,664 B1* | 5/2002 | Hellums et al. ............ 327/525 |
| 6,577,525 B2* | 6/2003 | Baker ......................... 365/148 |
| 6,906,557 B1* | 6/2005 | Parker et al. ................. 327/53 |
| 7,009,443 B2* | 3/2006 | Illegems ..................... 327/525 |
| 2006/0119384 A1* | 6/2006 | Camarota et al. ............. 326/38 |

* cited by examiner

*Primary Examiner*—Andrew Q. Tran
*Assistant Examiner*—Harry W Byrne
(74) *Attorney, Agent, or Firm*—Koppel, Patrick, Heybl & Dawson

(57) ABSTRACT

A dynamically read fuse cell includes a first circuit which includes a known reference resistance $R_{ref}$, and a second circuit which includes a programmed fuse having a resistance $R_{fuse}$; the state of the programmed fuse is to be read. The first and second circuits receive a common "read" signal, and are arranged to produce first and second outputs which begin changing state in response; the first and second outputs have respective slew rates which vary with $R_{ref}$ and $R_{fuse}$, respectively. The first and second circuits are interconnected such that causing both outputs to begin changing state in response to the "read" signal triggers a time domain race condition, the result of which indicates which of the outputs slewed more quickly in response to the "read" signal, thereby indicating the relationship between $R_{ref}$ and $R_{fuse}$ and, when $R_{ref}$ is properly chosen, the state of the fuse.

20 Claims, 5 Drawing Sheets

DYNAMICALLY READ FUSE CELL

BACKGROUND OF THE INVENTION

1. Field of the Invention

This invention relates to the field of programmable fuses, and particularly to methods for reading the state of such fuses.

2. Description of the Related Art

Programmable fuses are commonly used as non-volatile memory devices, with a blown fuse representing, for example, a logic '1', and an intact or unblown fuse representing a logic '0'. A programmable fuse in combination with the components required to read its state (i.e., intact or blown) is referred to as a "fuse cell".

Numerous techniques have been developed to determine whether a particular fuse is blown or intact. One common method is to apply a known current through the fuse. The voltage developed across the fuse due to the fuse's resistance ($R_{fuse}$) is compared with a predetermined threshold value to determine whether the fuse represents a '1' or a '0'. However, when replicated across a large number of fuses, current consumption for this approach can be unacceptably high.

Another fuse cell reading method is illustrated in FIG. 1. Here, a programmed fuse 10 is installed in the output leg of an upper current mirror 12 made from FETs MP1 and MP2, and a reference resistance $R_{ref}$ is installed in the output leg of a lower current mirror 14 made from FETs MN1 and MN2. The current mirrors are connected at a node 16, which is buffered with a logic gate 18 that produces an output OUT.

Resistance $R_{ref}$ is selected to establish a threshold with which $R_{fuse}$ is compared to determine whether fuse 10 is intact or blown. In operation, supply voltage VDD is applied to the cell, output OUT is latched, and the cell is powered down. Assuming MP1 and MN1 are matched and that MP2 and MN2 are matched, node 16 is pulled down (and OUT goes high and is latched) when $R_{fuse}>R_{ref}$, and node 16 is pulled up (and OUT goes low and is latched) when $R_{fuse}<R_{ref}$.

However, when arranged as shown, the voltage across fuse 10 is relatively small. This renders the cell particular sensitive to mismatches between the $V_{gs}$ voltages of the cell's FETs. Increasing this voltage requires an undesirable increase in current.

SUMMARY OF THE INVENTION

A dynamically read fuse cell is presented which overcomes the problems noted above, providing reliable fuse state readings with a low current consumption per cell.

The present fuse cell comprises a first circuit which includes a known reference resistance $R_{ref}$, and a second circuit which includes a programmed fuse having a resistance $R_{fuse}$; the state of the programmed fuse is to be read. The first and second circuits receive a common "read" signal, and are arranged to produce first and second outputs which begin changing state in response; the first and second outputs change state with slew rates that vary with $R_{ref}$ and $R_{fuse}$, respectively. The first and second circuits are interconnected such that causing both outputs to begin changing state in response to the common "read" signal triggers a time domain race condition, the result of which indicates which of the outputs slewed more quickly in response to the "read" signal, thereby indicating the relationship between $R_{ref}$ and $R_{fuse}$. When $R_{ref}$ is properly chosen, the relationship between $R_{ref}$ and $R_{fuse}$ indicates the state of the programmed fuse.

The first and second circuits are preferably first and second NAND gates, each of which has at least two inputs. To affect the slew rate of each gate's output, resistances $R_{ref}$ and $R_{fuse}$ are preferably connected to conduct the ground currents of respective gates. Each of the NAND gates receives the "read" signal at one of its inputs, and the output of the other NAND gate at another of its inputs, thereby forming an S-R latch. Each cell is preferably arranged such that the "read" signal is initially at a logic "low" level to force the gates into a known starting condition, and is then toggled to a logic "high" level to trigger the race condition and reveal the fuse's state. The new circuit does not require any analog bias currents, which provides an advantage over prior art designs.

Further features and advantages of the invention will be apparent to those skilled in the art from the following detailed description, taken together with the accompanying drawings.

DETAILED DESCRIPTION OF THE INVENTION

The present invention is a fuse cell in which the state of a programmed fuse is determining by triggering a time domain race condition that serves to compare the resistances of the fuse ($R_{fuse}$) and a reference resistance ($R_{ref}$). The cell is arranged such that the result of the race condition indicates the relationship between $R_{fuse}$ and $R_{ref}$, and, when $R_{ref}$ is properly chosen, the state of the programmed fuse.

Figure 2:
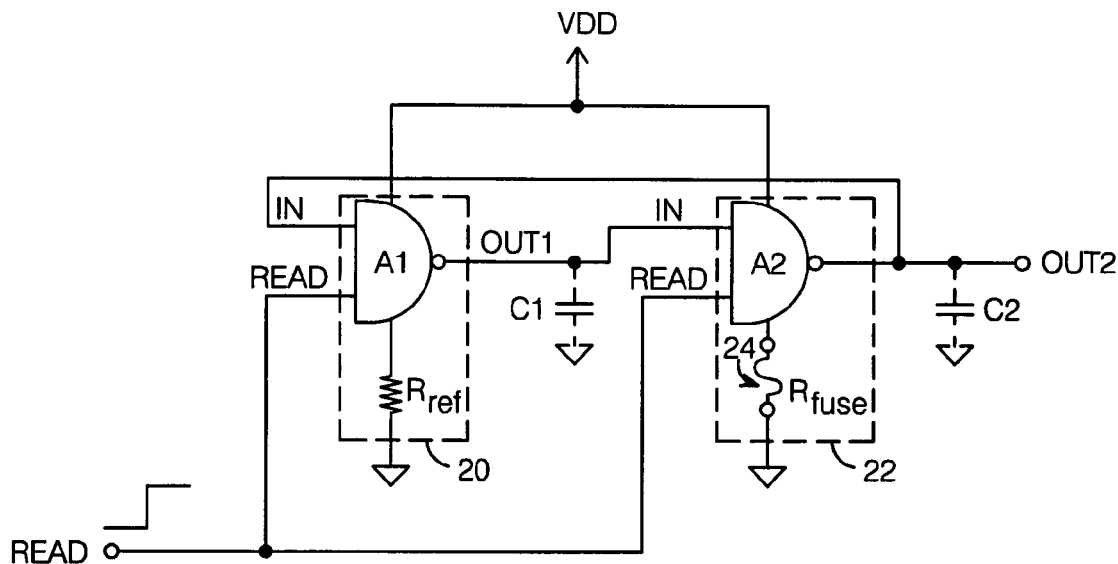
FIG. 2 is a schematic diagram of a fuse cell per the present invention.

The basic principles of a fuse cell in accordance with the present invention are illustrated in FIG. 2. A first circuit 20 includes a reference resistance $R_{ref}$, and a second circuit 22 includes a programmed fuse having a resistance $R_{fuse}$. Circuit 20 is arranged to produce a first output OUT1 which begins changing state in response to a "read" signal, and circuit 22 is arranged to produce a second output OUT2 which begins changing state in response to the same "read" signal. OUT1 changes state at a slew rate determined by an RC time constant which is approximately given by $R_{ref}*C1$, where C1 is the capacitance (typically stray or parasitic) present on the line driven by OUT1. Similarly, OUT2 changes state at a slew rate determined by an RC time constant which is approximately given by $R_{fuse}*C2$, where C2 is the capacitance present on the line driven by OUT2.

Circuits 20 and 22 are interconnected such that the "read" signal triggers a time domain race condition between outputs OUT1 and OUT2. Since the slew rates of OUT1 and OUT2 vary with $R_{ref}$ and $R_{fuse}$, respectively, the outcome of the race condition is indicative of the relationship between $R_{ref}$ and $R_{fuse}$. In the example shown in FIG. 2, this arrangement is realized using 2-input NAND gates A1 and A2 for circuits 20 and 22, respectively, with the "read" signal connected to one input of each gate (labeled "READ"), and the output of the opposite gate connected to each gate's other input ("IN")—thereby forming an S-R latch. In this exemplary embodiment, reference resistance $R_{ref}$ is connected between A1's ground node and circuit ground, and a programmed fuse 24 having a resistance $R_{fuse}$ is connected between A2's ground node and circuit ground.

Figure 3:
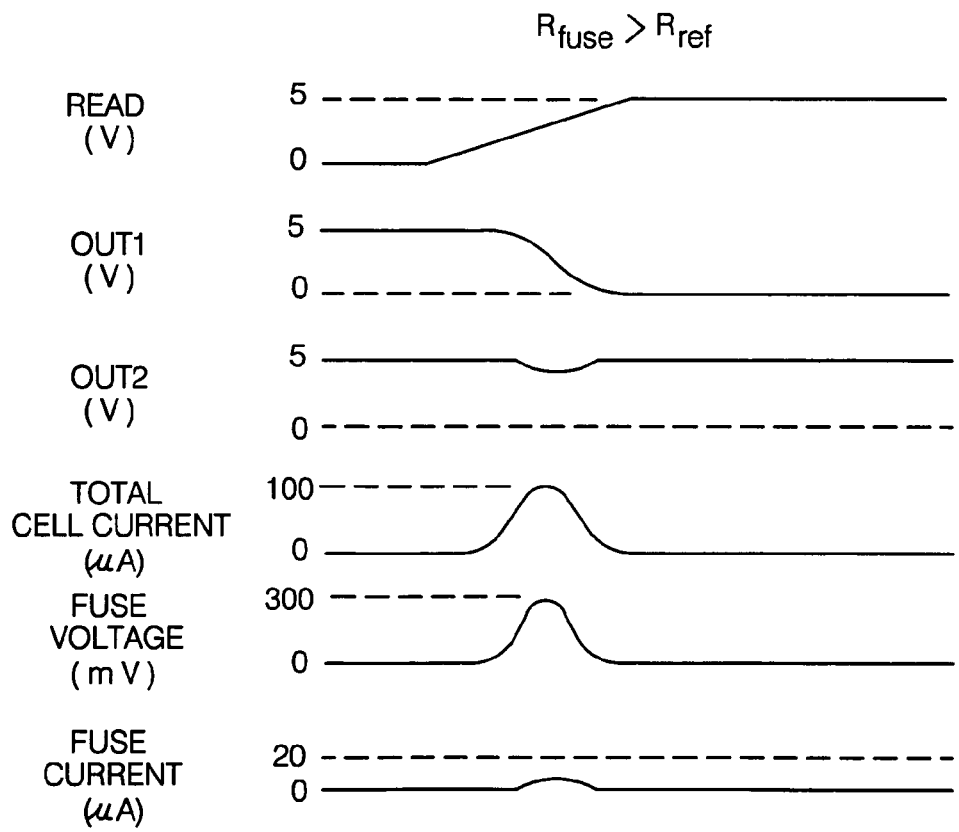
FIG. 3 is a timing diagram illustrating the operation of the fuse cell shown in FIG. 2 when $R_{fuse}>R_{ref}$.

The timing diagram shown in FIG. 3 illustrates the operation of the cell when $R_{fuse} > R_{ref}$. To establish a known starting point, "read" is initially set to a logic "low", forcing both OUT1 and OUT2—and thus both "IN" inputs—to a logic "high" state. Then, to determine the state of fuse 24, the "read" signal is taken "high". With both inputs of each gate now "high", each will try to drive its output "low". However, since the outputs are cross-coupled, both outputs cannot remain low; thus, bringing "read" high triggers a time domain race condition between OUT1 and OUT2.

The race condition will be won by the gate having the fastest slew rate, which varies with the resistance connected between each gate's ground node and circuit ground. In this example, $R_{fuse}$ is greater than $R_{ref}$. As such, in response to the "read" signal being taken "high", A1's output OUT1 will slew towards a logic "low" more quickly than will OUT2. As such, OUT1 will completely transition to "low", which causes OUT2 to stop slewing down and to return to a "high" state. Thus, when $R_{fuse} > R_{ref}$, the race condition ends with OUT1 and OUT2 at stable "low" and "high" levels, respectively.

Resistance $R_{ref}$ is selected to establish a threshold with which $R_{fuse}$ is compared to determine whether fuse 24 is intact or blown. The value of $R_{ref}$ should be selected to be somewhere between the typical 'intact' and 'blown' resistance values for the type of fuse being read. For example, one type of fuse may have a resistance when 'intact' of about 1.4 k$\Omega$, and a resistance when 'blown' of about 30 k$\Omega$. As such, the value of $R_{ref}$ should be between 1.4 k$\Omega$ and 30 k$\Omega$. For good fuse state discrimination, the "gain" of the cell—which is proportional to the ratio of $R_{fuse}$ to $R_{ref}$—should be made as high as possible.

Power consumption for the fuse cell of FIG. 2 is virtually zero whenever the cell is not being read, as there is no steady-state quiescent current consumption of power for this circuit. As shown in FIG. 3, total cell current, fuse voltage and fuse current increase only while the "read" signal is transitioning. Total cell current is typically less than 100 µApeak), fuse current is typically less than 20 uA (peak), and fuse voltage is typically less than 300 mv (peak). Currents only last a couple of nanoseconds or so, thus, stress on the fuse during a "read" is low. As noted above, the new circuit does not require any analog bias currents, thereby doing away with the need to set up a bias, letting it stabilize, reading the fuse state, etc. as required by some prior art designs. The invention only requires a single, digital edge transition to read and latch the fuses.

Figure 1:
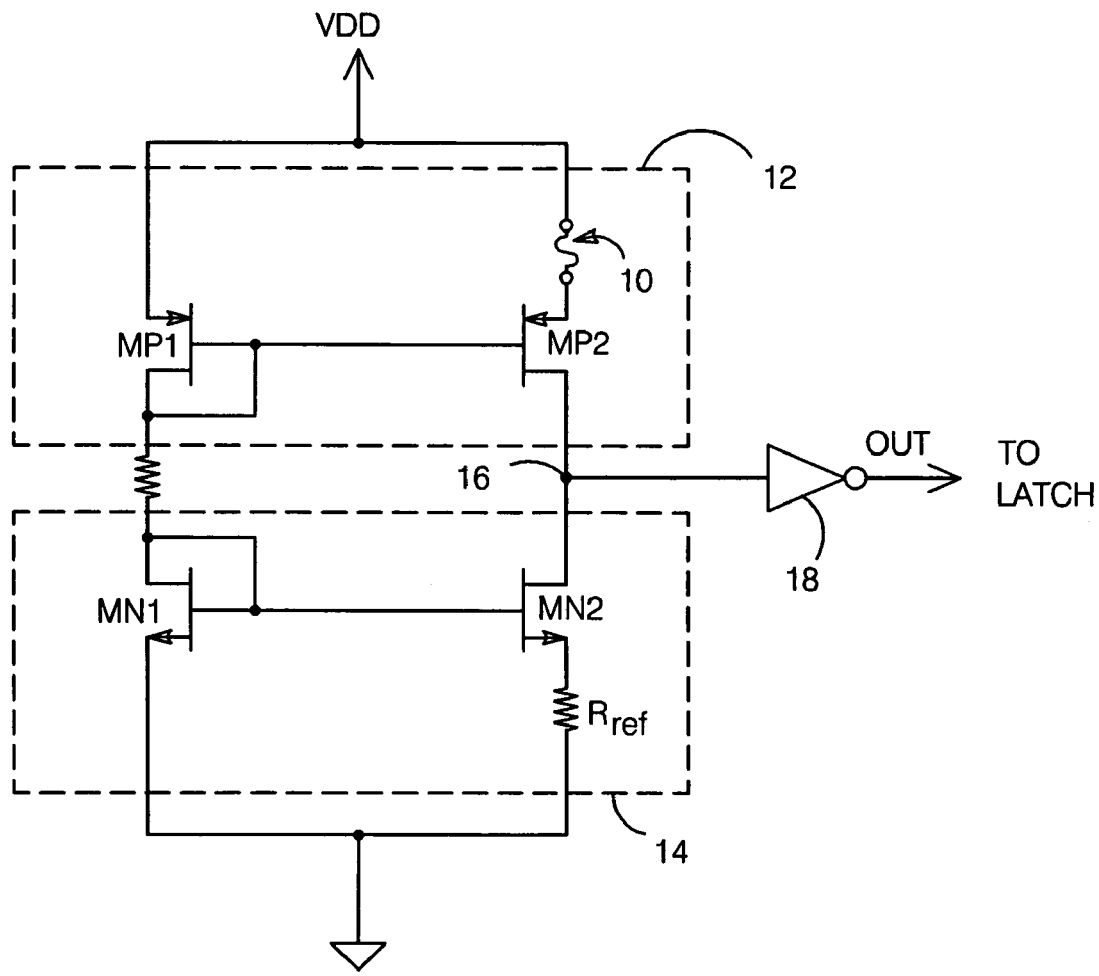
FIG. 1 is a schematic diagram of a known fuse cell.
Figure 4:
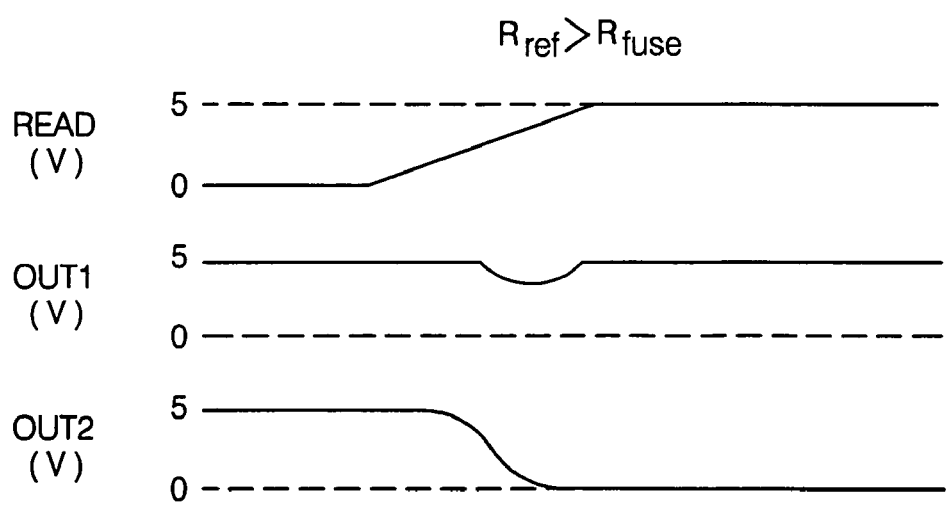
FIG. 4 is a timing diagram illustrating the operation of the fuse cell shown in FIG. 2 when $R_{ref}>R_{fuse}$.

The timing diagram shown in FIG. 4 illustrates the operation of the cell when $R_{ref} > R_{fuse}$. As before, the "read" signal is initially set "low", forcing both OUT1 and OUT2 to logic "high" states. A "read" is performed by taking the read signal "high", triggering a race condition between OUT1 and OUT2. Now, $R_{ref}$ is greater than $R_{fuse}$; as such, OUT2 slews towards "low" more quickly than OUT1. OUT2 completely transitions to "low", causing OUT1 to return to a "high" state. Thus, when $R_{ref} > R_{fuse}$, the race condition ends with OUT1 and OUT2 at stable "high" and "low" levels, respectively.

The reference resistance $R_{ref}$ may be implemented with a resistor; alternatively, a second programmable fuse might be employed as the reference resistance, such that either one or the other fuse is programmed, but never both. The difference between a blown and unblown fuse is larger than the difference between a fuse and a reference resistor whose value is somewhere between an unblown and blown fuse value; hence, detection of the programmed state is easier when two fuses are used. The drawback of this method is that prior to programming, the output is undeterministic as both fuses are equal valued.

Note that, though FIG. 2 depicts using NAND gates to create the required time domain race condition, other types of logic gates or circuits could also be used, such as NOR gates with the fuses and reference resistances connected to the positive supply instead of ground. Two circuits are required, with one circuit having an output with a slew rate that varies with a known reference resistance ($R_{ref}$), and the other having an output with a slew rate that varies with the resistance of a programmed fuse ($R_{fuse}$) to be read. The two circuits must be interconnected such that causing both outputs to begin changing state in response to a common "read" signal triggers a time domain race condition, the result of which indicates which of the outputs slewed more quickly, thereby indicating the relationship between $R_{ref}$ and $R_{fuse}$.

Figure 5:
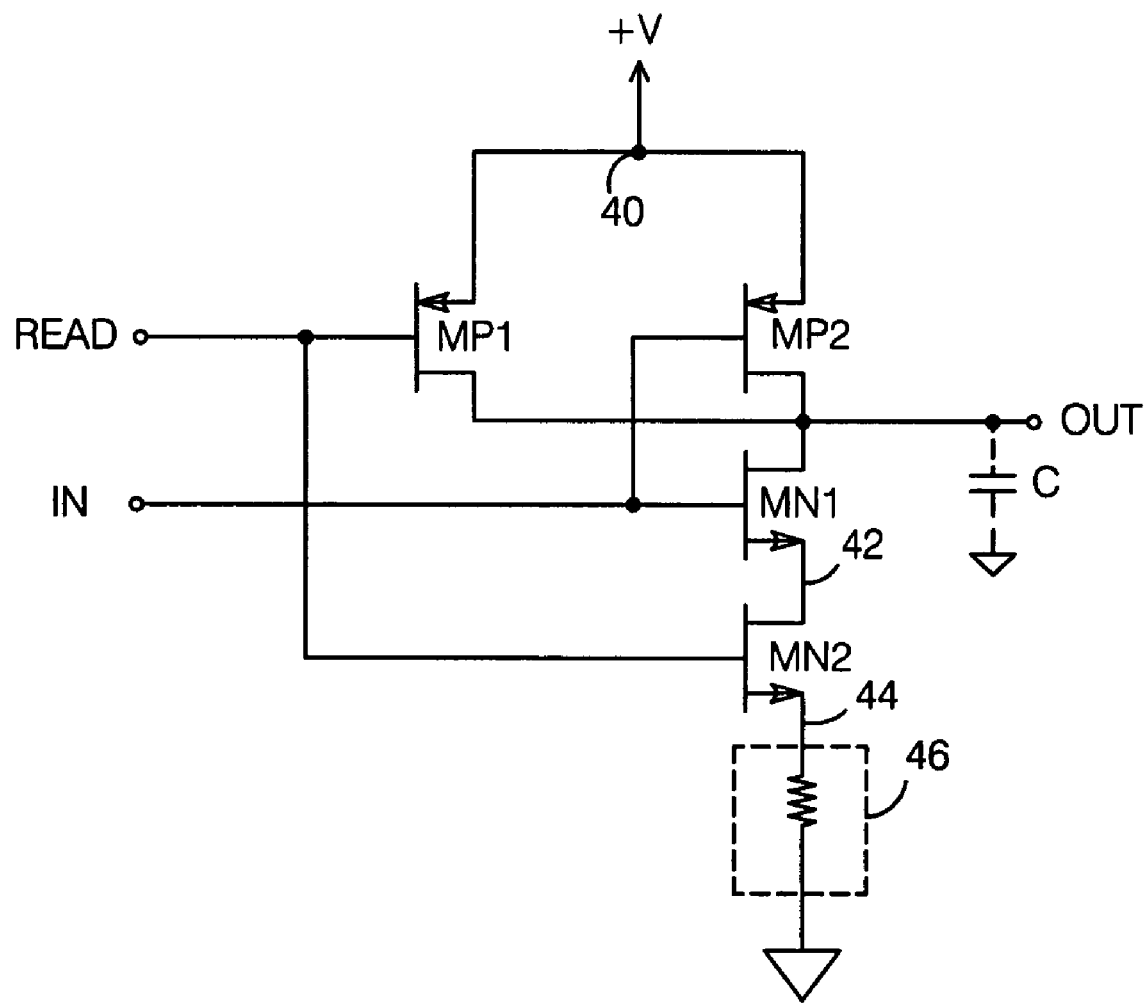
FIG. 5 is a schematic diagram of one possible embodiment of a NAND gate as might be employed in a fuse cell per the present invention.

One possible implementation of a logic gate as might be employed in a fuse cell per the present invention is shown in FIG. 5. In this exemplary embodiment, the gate is a NAND. A PMOS FET MP1 is connected between a power node 40 connected to a supply voltage V+ and the gate's output node (OUT) and is controlled by the signal applied to the READ input. A PMOS FET MP2 is connected between V+ and OUT and controlled by the signal applied to the IN input. An NMOS FET MN1 is connected between OUT and a node 42 and controlled by IN, and an NMOS FET MN2 is connected between node 40 and a ground node 44 coupled to circuit ground and controlled by READ.

A resistance 46—either reference resistance $R_{ref}$ or the resistance of a programmed fuse $R_{fuse}$—is connected between ground node 44 and circuit ground such that it conducts the gate's ground current. When so arranged, the rate at which the gate's output can change state varies with the magnitude of resistance 46, with the output's slew rate decreasing with increasing resistance.

FET MN2 is simply used as a switch which serves as a buffer between resistance 46 and MN1; as such, the operation of the cell has no sensitivity to $V_{gs}$ as in prior art designs. MN2 does have an 'on' resistance $R_{on}$ which has some effect on cell operation, but the $R_{on}$ values for FETs on a common die tend to match better than do their gate-source voltages. When arranged as shown, very little stress is placed on the programmed fuse: there would typically be no more than about 300 mv across the fuse for the duration of the race condition—generally around 5 ns. When arranged as shown in FIG. 5a, OUT changes state at a slew rate determined by an RC time constant $\tau_c$ given by $\tau_c = (R + R_{on}) * C$, where R is resistance 46 (either $R_{ref}$ or $R_{fuse}$) and C is the capacitance on output line OUT.

Figure 6:
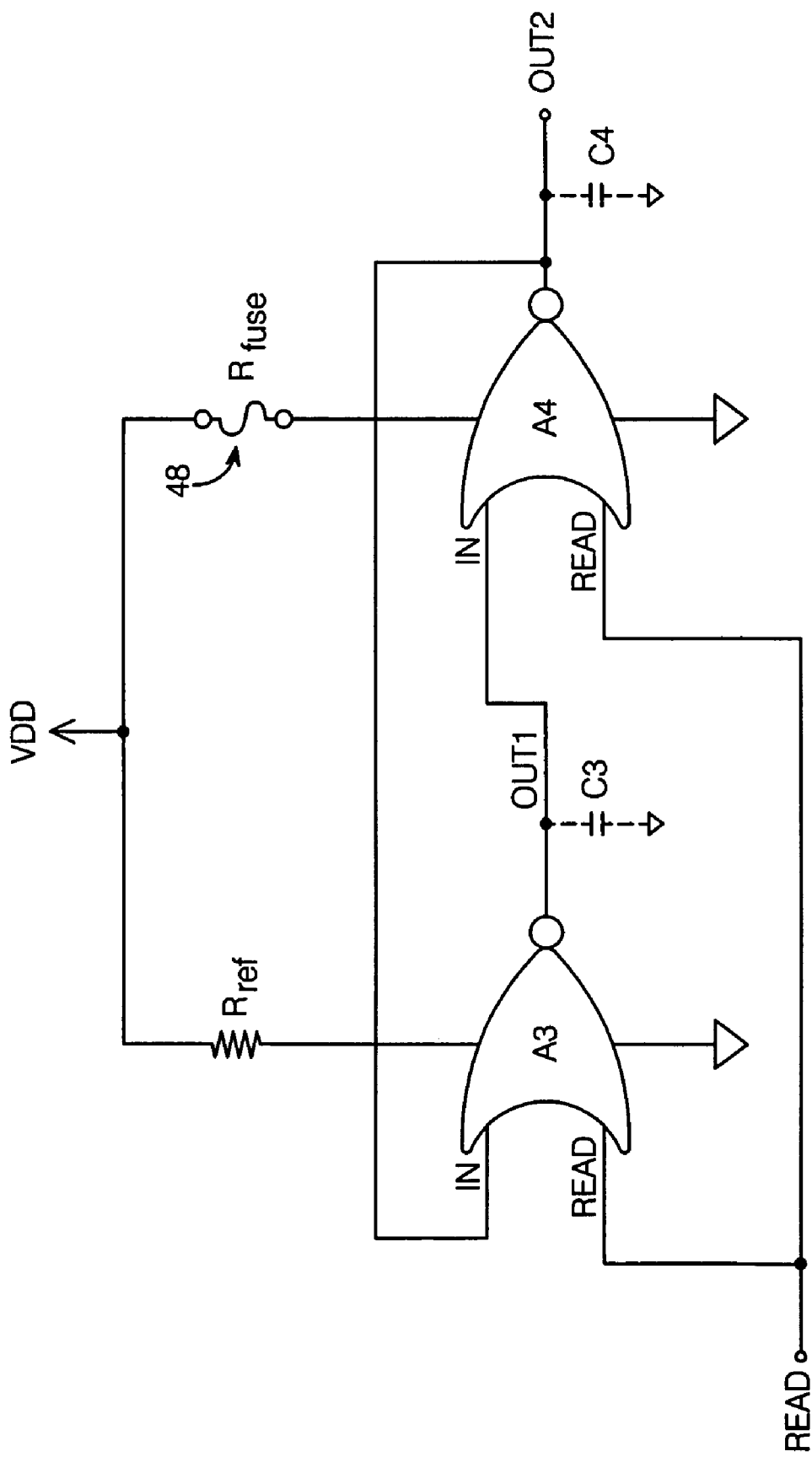
FIG. 6 is a schematic diagram of another possible embodiment of a fuse cell per the present invention.

As noted above, the invention could be implemented with a variety of logic gates or circuits. An exemplary implementation which employs NOR gates is shown in FIG. 6. A first NOR gate A3 has a reference resistance $R_{ref}$ connected in series between positive supply VDD and the gate's supply pin, and a second NOR gate A4 has a programmed fuse 48 having a resistance $R_{fuse}$ connected between VDD and its supply pin. NOR gates A3 and A4 produce outputs OUT1 and OUT2, respectively, which change state at slew rates determined by RC time constants $R_{ref}*C3$ and $R_{fuse}*C4$ respectively. A "read" signal is connected to one input of each gate (labeled "READ"), and the output of the opposite gate is connected to each gate's other input ("IN").

The circuit operates in a fashion similar to that of the NAND gate implementation shown in FIG. 2. As with that embodiment, the READ signal is used to trigger a time domain race condition between outputs OUT1 and OUT2, with the outcome of the race condition indicative of the relationship between $R_{ref}$ and $R_{fuse}$. To establish a known starting point, READ is initially set to a logic "high", forcing OUT1, OUT2 and both "IN" inputs to a logic "low" state. To determine the state of fuse 48, READ is taken "low". With both inputs of each gate now "low", each will try to drive its output "high". However, since the outputs are cross-coupled, both outputs cannot remain high; thus, bringing READ low triggers a time domain race condition between OUT1 and OUT2. The race condition will be won by the gate having the fastest slew rate, which varies with the resistance connected between each gate's supply pin and VDD. For example, if $R_{fuse}$ is greater than $R_{ref}$, OUT1 will slew towards a logic "high" more quickly than will OUT2. As such, OUT1 will completely transition to "high", which causes OUT2 to stop slewing up and to return to a "low" state. Thus, when $R_{fuse}>R_{ref}$, the race condition ends with OUT1 and OUT2 at stable "high" and "low" levels, respectively. Similarly, when $R_{ref}>R_{fuse}$, the race condition ends with OUT1 and OUT2 at stable "low" and "high" levels, respectively.

Figure 7:
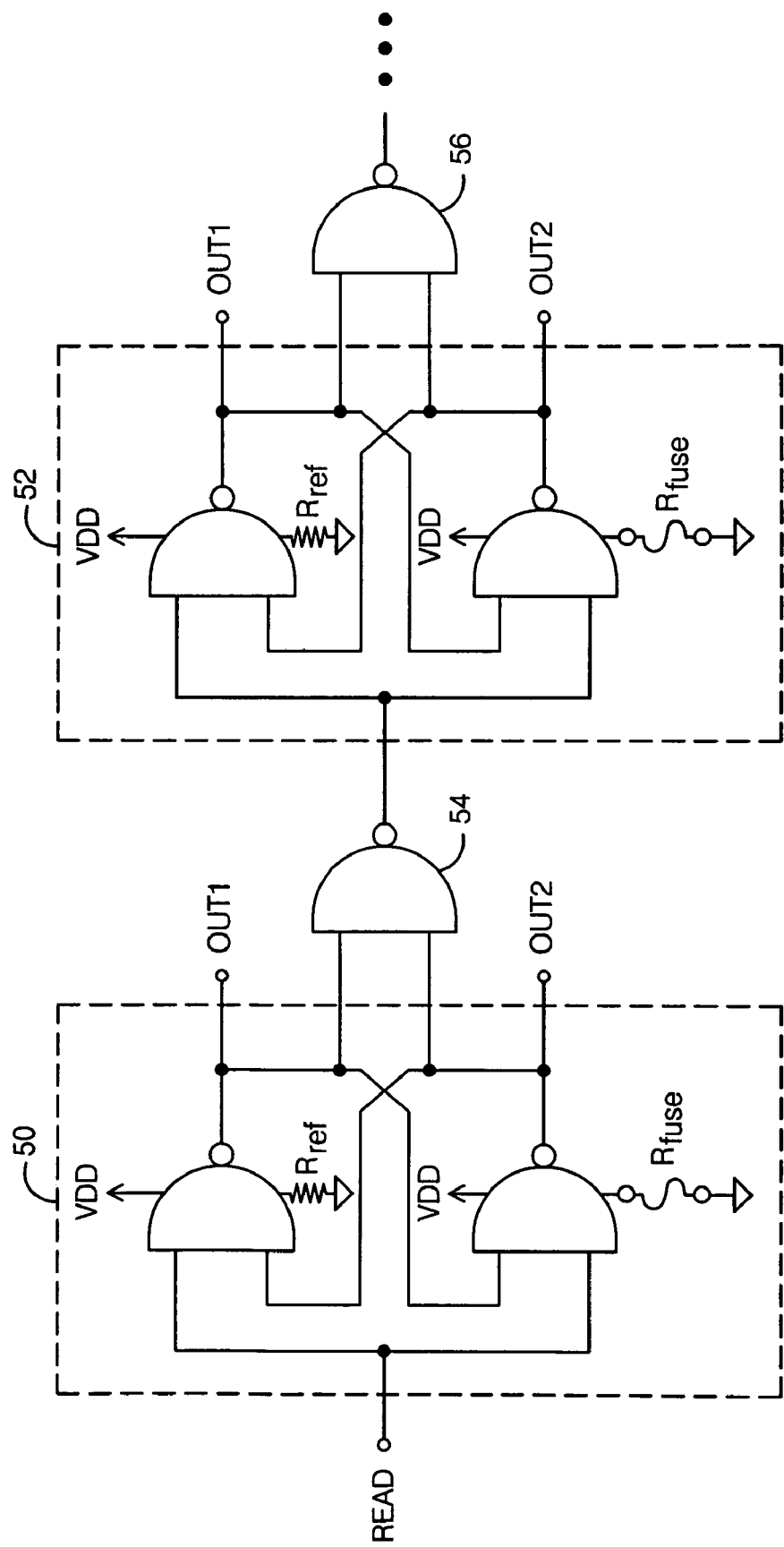
FIG. 7 is a schematic diagram of a serially connected embodiment of a fuse cell system per the present invention.

Another possible arrangement is shown in FIG. 7. A plurality of individual fuse cells (50, 52) are as described above (e.g., configured as shown in FIG. 2). Here, however, the fuse cells are serially-connected, with respective NAND gates (54, 56) interposed between adjacent fuse cells and connected as shown. The "read" signal is applied to the first of the series-connected cells, and is propagated to each successive cell via the interposed NAND gates. This serves to distribute the logic transition read-energy over time, which may be desirable when reading the states of a large number of fuses.

While particular embodiments of the invention have been shown and described, numerous variations and alternate embodiments will occur to those skilled in the art. Accordingly, it is intended that the invention be limited only in terms of the appended claims.

We claim:

1. A dynamically read fuse cell, comprising:
   a first circuit which includes a known reference resistance $R_{ref}$ and at least two inputs, said first circuit arranged to receive a "read" signal at one of said inputs and to produce a first output which begins changing state in response to said "read" signal and has a slew rate which varies with $R_{ref}$; and
   a second circuit which includes a programmed fuse having a resistance $R_{fuse}$ and at least two inputs, said second circuit arranged to receive said "read" signal at one of said inputs and to produce a second output which begins changing state in response to said "read" signal and has a slew rate which varies with $R_{fuse}$;
   said first and second circuits interconnected such that the output of each of said circuits is connected to an input of the other of said circuits, such that causing both outputs to begin changing state in response to the common "read" signal triggers a time domain race condition, the result of which indicates which of said outputs slewed more quickly in response to said "read" signal, thereby indicating the relationship between $R_{ref}$ and $R_{fuse}$.

2. A dynamically read fuse cell, comprising:
   a first circuit which includes a known reference resistance $R_{ref}$, said first circuit arranged to receive a "read" signal and to produce a first output which begins changing state in response to said "read" signal and has a slew rate which varies with $R_{ref}$; and
   a second circuit which includes a programmed fuse having a resistance $R_{fuse}$, said second circuit arranged to receive said "read" signal and to produce a second output which begins changing state in response to said "read" signal and has a slew rate which varies with $R_{fuse}$;
   said first and second circuits interconnected such that causing both outputs to begin changing state in response to the common "read" signal triggers a time domain race condition, the result of which indicates which of said outputs slewed more quickly in response to said "read" signal, thereby indicating the relationship between $R_{ref}$ and $R_{fuse}$;
   wherein said first and second circuits are first and second logic gates having power and ground nodes which are coupled to first and second power supply voltages and carry power and ground currents, respectively, said resistance $R_{ref}$ connected to conduct one of said first gate's power and ground currents and said resistance $R_{fuse}$ connected to conduct one of said second gate's power and ground currents.

3. The fuse cell of claim 2, wherein said first and second logic gates comprise first and second NAND gates, respectively, each of said NAND gates having at least two inputs, each of said NAND gates receiving said "read" signal at one of its inputs and the output of the other NAND gate at another of its inputs thereby forming an S-R latch, said cell arranged such that said "read" signal is initially at a logic "low" level to force the gates into a known starting condition, and is then toggled to a logic "high" level to trigger said race condition.

4. The fuse cell of claim 3, wherein each of said NAND gates comprises:
   first and second p-type transistors (MP1,MP2) having respective control inputs and current circuits, said current circuits connected between said power node and said gate's output node;
   a first n-type transistor (MN1) having a control input and a current circuit, said current circuit connected between said output node and a first node;
   a second n-type transistor (MN2) having a control input and a current circuit, said current circuit connected between said first node and a second node which is coupled to said ground node;
   the control inputs of MP1 and MN2 connected to a first input node; and
   the control inputs of MP2 and MN1 connected to a second input node, said gate receiving said "read" signal at said first input node and the output of the other NAND gate at said second input node.

5. The fuse cell of claim 4, wherein said resistances $R_{ref}$ and $R_{fuse}$ are connected between said second node and said ground node of their respective gates.

6. The fuse cell of claim 3, further comprising:
   a plurality of additional fuse cells connected in series with said fuse cell; and
   a plurality of additional NAND gates, each of which is interposed between adjacent ones of said series-connected fuse cells, each of said additional NAND gates connected at a first input to the output of one NAND gate of a given fuse cell and at a second input to the output of the other NAND gate of a given fuse cell such that the output of said additional NAND gate provides said "read" signal for the following fuse cell.

7. The fuse cell of claim 2, wherein said first and second logic gates comprise first and second NOR gates, respectively, each of said NOR gates having at least two inputs, each of said NOR gates receiving said "read" signal at one of its inputs and the output of the other NOR gate at another of its inputs, said cell arranged such that said "read" signal is initially at a logic "high" level to force the gates into a known starting condition, and is then toggled to a logic "low" level to trigger said race condition.

8. The fuse cell of claim 7, wherein said resistances $R_{ref}$ and $R_{fuse}$ are connected between the power nodes of their respective gates and said first power supply voltage.

9. The fuse cell of claim 1, wherein said resistance $R_{ref}$ comprises a resistor.

10. The fuse cell of claim 1, wherein said resistance $R_{ref}$ comprises at least one programmable fuse.

11. A dynamically read fuse cell, comprising:
a first logic gate having power and ground nodes which are coupled to first and second power supply voltages and carry power and ground currents, respectively, said first gate including a known reference resistance $R_{ref}$ connected to conduct said first gate's ground current; and
a second logic gate having power and ground nodes which are coupled to said first and second power supply voltages and carry power and ground currents, respectively, said second gate including a programmed fuse having a resistance $R_{fuse}$ connected to conduct said second gate's ground current;
said first and second logic gates arranged to receive a common "read" signal and to produce first and second outputs, respectively, which begin changing state in response to said "read" signal, said first logic gate's output having a slew rate which varies with $R_{ref}$ and said second logic gate's output having a slew rate which varies with $R_{fuse}$;
said first and second logic gates interconnected such that causing both outputs to begin changing state in response to said common "read" signal triggers a time domain race condition, the result of which indicates which of said outputs slewed more quickly in response to said "read" signal, thereby indicating the relationship between $R_{ref}$ and $R_{fuse}$.

12. The fuse cell of claim 11, wherein said first and second logic gates comprise first and second NAND gates, respectively, each of said NAND gates having at least two inputs, each of said NAND gates receiving said "read" signal at one of its inputs and the output of the other NAND gate at another of its inputs thereby forming an S-R latch, said cell arranged such that said "read" signal is initially at a logic "low" level to force the gates into a known starting condition, and is then toggled to a logic "high" level to trigger said race condition.

13. The fuse cell of claim 11, wherein said first and second logic gates comprise first and second NOR gates, respectively, each of said NOR gates having at least two inputs, each of said NOR gates receiving said "read" signal at one of its inputs and the output of the other NOR gate at another of its inputs, said cell arranged such that said "read" signal is initially at a logic "high" level to force the gates into a known starting condition, and is then toggled to a logic "low" level to trigger said race condition.

14. The fuse cell of claim 11, wherein said resistance $R_{ref}$ comprises a resistor.

15. The fuse cell of claim 11, wherein said resistance $R_{ref}$ comprises at least one programmable fuse.

16. A dynamically read fuse cell, comprising:
a first NAND gate having power and ground nodes which are coupled to first and second power supply voltages and carry power and ground currents, respectively, said first gate including a known reference resistance $R_{ref}$ connected to conduct said first gate's ground current; and
a second NAND gate having power and ground nodes which are coupled to said first and second power supply voltages and carry power and ground currents, respectively, said second gate including a programmed fuse having a resistance $R_{fuse}$ connected to conduct said second gate's ground current;
each of said first and second NAND gates arranged to receive a common "read" signal at one of its inputs and the output of the other NAND gate at another of its inputs thereby forming an S-R latch, and to produce first and second outputs, respectively, which begin changing state in response to said "read" signal, said first NAND gate's output having a slew rate which varies with $R_{ref}$ and said second NAND gate's output having a slew rate which varies with $R_{fuse}$;
said cell arranged such that said "read" signal is initially at a logic "low" level to force said NAND gates into a known starting condition, and is then toggled to a logic "high" level to trigger a time domain race condition, the result of which indicates which of said first and second outputs slewed more quickly in response to said "read" signal, thereby indicating the relationship between $R_{ref}$ and $R_{fuse}$.

17. The fuse cell of claim 16, further comprising:
a plurality of additional fuse cells connected in series with said fuse cell; and
a plurality of additional NAND gates, each of which is interposed between adjacent ones of said series-connected fuse cells, each of said additional NAND gates connected at a first input to the output of one NAND gate of a given fuse cell and at a second input to the output of the other NAND gate of a given fuse cell such that the output of said additional NAND gate provides said "read" signal for the following fuse cell.

18. A dynamically read fuse cell, comprising:
a first NOR gate having power and ground nodes which are coupled to first and second power supply voltages and carry power and ground currents, respectively, said first gate including a known reference resistance $R_{ref}$ connected to conduct said first gate's power current; and
a second NOR gate having power and ground nodes which are coupled to said first and second power supply voltages and carry power and ground currents, respectively, said second gate including a programmed fuse having a resistance $R_{fuse}$ connected to conduct said second gate's power current;
each of said first and second NOR gates arranged to receive a common "read" signal at one of its inputs and the output of the other NOR gate at another of its inputs and to produce first and second outputs, respectively, which begin changing state in response to said "read" signal, said first NOR gate's output having a slew rate which varies with $R_{ref}$ and said second NOR gate's output having a slew rate which varies with $R_{fuse}$;

said cell arranged such that said "read" signal is initially at a logic "high" level to force said NOR gates into a known starting condition, and is then toggled to a logic "low" level to trigger a time domain race condition, the result of which indicates which of said first and second outputs slewed more quickly in response to said "read" signal, thereby indicating the relationship between $R_{ref}$ and $R_{fuse}$.

19. A method of reading the state of a programmed fuse, comprising:

providing a first circuit which includes at least two inputs and a programmed fuse, the state of which is to be determined, said first circuit arranged to receive a "read" signal at one of said inputs and to produce a first output which begins changing state in response to said "read" signal and has a slew rate which varies with the resistance of said fuse ($R_{fuse}$);

providing a second circuit which includes at least two inputs and a reference resistance, said second circuit arranged to receive said "read" signal at one of said inputs and to produce a second output which begins changing state in response to said "read" signal and has a slew rate which varies with said reference resistance ($R_{ref}$);

interconnecting said first and second circuits such that the output of each of said circuits is connected to an input of the other of said circuits, such that causing both outputs to begin changing state in response to the common "read" signal triggers a time domain race condition, the result of which indicates which of said outputs slewed more quickly in response to said "read" signal, thereby indicating the relationship between $R_{ref}$ and $R_{fuse}$; and providing said "read" signal such that said time domain race condition is triggered.

20. A method of reading the state of a programmed fuse, comprising:

providing a first circuit which includes a programmed fuse, the state of which is to be determined, said first circuit arranged to receive a "read" signal and to produce a first output which begins changing state in response to said "read" signal and has a slew rate which varies with the resistance of said fuse ($R_{fuse}$);

providing a second circuit which includes a reference resistance, said second circuit arranged to receive said "read" signal and to produce a second output which begins changing state in response to said "read" signal and has a slew rate which varies with said reference resistance ($R_{ref}$);

interconnecting said first and second circuits such that causing both outputs to begin changing state in response to the common "read" signal triggers a time domain race condition, the result of which indicates which of said outputs slewed more quickly in response to said "read" signal, thereby indicating the relationship between $R_{ref}$ and $R_{fuse}$;

providing said "read" signal such that said time domain race condition is triggered; and initializing said first and second circuits such that said first and second outputs are in a known state prior to providing said "read" signal which triggers said time domain race condition.

* * * * *